(12) United States Patent
Choi et al.

(10) Patent No.: US 11,148,150 B2
(45) Date of Patent: Oct. 19, 2021

(54) LIQUID DISPENSING NOZZLE AND SUBSTRATE TREATING APPARATUS

(71) Applicant: SEMES CO., LTD., Chungcheongnam-do (KR)

(72) Inventors: Byoungdoo Choi, Seoul (KR); Yangyeol Ryu, Cheonan-si (KR); Dong Sub Oh, Busan (KR); Hye Bin Baek, Incheon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/659,355

(22) Filed: Oct. 21, 2019

(65) Prior Publication Data
US 2020/0122165 A1    Apr. 23, 2020

(30) Foreign Application Priority Data
Oct. 19, 2018  (KR) .......................... 10-2018-0125479

(51) Int. Cl.
| | | |
|---|---|---|
| *B05B 1/04* | (2006.01) | |
| *B05B 1/34* | (2006.01) | |
| *B05C 5/02* | (2006.01) | |
| *B05C 5/00* | (2006.01) | |

(52) U.S. Cl.
CPC ............ *B05B 1/044* (2013.01); *B05B 1/3402* (2018.08); *B05C 5/002* (2013.01); *B05C 5/0208* (2013.01)

(58) Field of Classification Search
None
See application file for complete search history.

(56) References Cited

U.S. PATENT DOCUMENTS

| | | | | |
|---|---|---|---|---|
| 2,967,112 A | * | 1/1961 | Kay .......................... | C03C 17/10 |
| | | | | 427/427 |
| 2008/0092813 A1 | * | 4/2008 | Nakashima ............. | G03F 7/162 |
| | | | | 118/712 |
| 2017/0028413 A1 | * | 2/2017 | Oh .......................... | B05B 7/061 |

FOREIGN PATENT DOCUMENTS

| | | | | |
|---|---|---|---|---|
| JP | 2005-205397 A | | 8/2005 | |
| JP | 2017011269 A | | 1/2017 | |
| KR | 1020070007262 A | | 1/2007 | |
| KR | 1020100083996 A | | 7/2010 | |
| KR | 1020150000671 A | | 1/2015 | |
| KR | 10-2016-0108653 A | | 9/2016 | |
| KR | 20080092813 | * | 9/2016 | ............. H01L 21/76 |
| KR | 1020180080074 A | | 7/2018 | |

\* cited by examiner

*Primary Examiner* — Jethro M. Pence
(74) *Attorney, Agent, or Firm* — Li & Cai Intellectual Property (USA) Office

(57) ABSTRACT

The inventive concept relates to a liquid dispensing nozzle and an apparatus for treating a substrate. The liquid dispensing nozzle includes a first fluid channel that is formed in the nozzle and through which a processing liquid flows and a second fluid channel in communication with the first fluid channel, the second fluid channel being connected to a dispensing end of the nozzle. The second fluid channel has a larger width than the first fluid channel, and a central axis of the first fluid channel and a central axis of the second fluid channel are connected with each other in a straight line.

12 Claims, 16 Drawing Sheets

A-A'

B-B'

LIQUID DISPENSING NOZZLE AND SUBSTRATE TREATING APPARATUS

CROSS-REFERENCE TO RELATED APPLICATIONS

A claim for priority under 35 U.S.C. § 119 is made to Korean Patent Application No. 10-2018-0125479 filed on Oct. 19, 2018, in the Korean Intellectual Property Office, the entire contents of which are hereby incorporated by reference.

BACKGROUND

Embodiments of the inventive concept described herein relate to a liquid dispensing nozzle and a substrate treating apparatus, and more particularly, relate to a liquid dispensing nozzle for dispensing a processing liquid onto a substrate, and a substrate treating apparatus including the liquid dispensing nozzle.

Various processes, such as photolithography, etching, ashing, thin-film deposition, cleaning, and the like, are performed to manufacture semiconductor elements and flat display panels. Among these processes, the photolithography process includes a coating process, an exposing process, and a developing process that are performed in a serial order. The coating process is a process of coating a substrate with a light-sensitive material such as photoresist. The exposing process is a process of printing a circuit pattern on the substrate having the photoresist film formed thereon by exposing the substrate to light. The developing process is a process of selectively developing the exposed region of the substrate. The developing process may include a developing solution dispensing step, a rinsing solution dispensing step, and a drying step.

FIG. 1 is a sectional view of a conventional liquid dispensing nozzle for dispensing a developing solution. FIG. 2 is a view illustrating a state in which the liquid dispensing nozzle of FIG. 1 dispenses a developing solution. FIG. 3 is a sectional view taken along line A-A' of FIG. 2. Referring to FIGS. 1 to 3, the conventional liquid dispensing nozzle 100 for dispensing a developing solution onto a substrate has a body 110, a circular fluid channel 130, and a slit fluid channel 150. In general, the circular fluid channel 130 is formed vertically downward from an upper end of the body 110. The slit fluid channel 150 is formed in an oblique direction with respect to the vertical axis of the circular fluid channel 130 so as to connect with the circular fluid channel 130. The developing solution introduced into the circular fluid channel 130 is dispensed through the slit fluid channel 150 in the manner of a liquid curtain.

However, the developing solution introduced into the liquid dispensing nozzle 100 collides with a lower end of the circular fluid channel 130 while flowing vertically downward from an upper end of the circular fluid channel 130. Therefore, a vortex of the developing solution occurs at the lower end of the circular fluid channel 130. The vortex generates bubbles in the developing solution. The bubbles in the developing solution cause a defect in the developing process.

Furthermore, the dispensing pressure transmitted to the developing solution is reduced due to the collision of the developing solution with the lower end of the circular fluid channel 130. Therefore, as illustrated in FIG. 2, the horizontal width of the liquid curtain of the developing solution dispensed is gradually decreased farther away from a dispensing end of the liquid dispensing nozzle 100. In this case, the time taken to perform the developing process is increased due to the narrow width of the developing solution dispensed onto the substrate.

Referring to the sectional view of the liquid curtain of the developing solution dispensed, the developing solution dispensed is concentrated on the opposite sides. That is, the vertical width of the liquid curtain of the developing solution is not uniform. This is because due to the collision of the developing solution in the circular fluid channel 130, the flow of the processing liquid in the fluid channel is not stabilized so that the vertical width of the liquid curtain is arbitrarily changed when the chemical is dispensed. In this case, the amounts of developing solution supplied are different for respective regions of the substrate. Therefore, the developing process is non-uniformly performed on the substrate, which affects a drop in the uniformity of the critical dimension (CD) of a pattern formed on the substrate.

SUMMARY

Embodiments of the inventive concept provide a liquid dispensing nozzle for improving efficiency in treating a substrate by dispensing a processing liquid, and a substrate treating apparatus including the liquid dispensing nozzle.

Furthermore, embodiments of the inventive concept provide a liquid dispensing nozzle for minimizing a vortex generated in a fluid channel formed in the nozzle, and a substrate treating apparatus including the liquid dispensing nozzle.

In addition, embodiments of the inventive concept provide a liquid dispensing nozzle for uniformly dispensing a processing liquid, and a substrate treating apparatus including the liquid dispensing nozzle.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a support unit including a support plate having a seating surface on which the substrate is supported and a liquid dispensing unit that dispenses a first processing liquid onto the substrate. The liquid dispensing unit includes a first nozzle that dispenses the first processing liquid, and the first nozzle includes a first fluid channel that is formed in the first nozzle and through which the first processing liquid flows and a second fluid channel in communication with the first fluid channel, the second fluid channel being connected to a dispensing end of the first nozzle. The second fluid channel has a larger width than the first fluid channel, and a central axis of the first fluid channel and a central axis of the second fluid channel are connected with each other in a straight line.

According to an embodiment, the first fluid channel may have a circular cross-section that is perpendicular to a lengthwise direction of the first fluid channel, and the second fluid channel may have a slit-shaped cross-section that is perpendicular to a direction in which the first processing liquid flows.

According to an embodiment, the width of the second fluid channel may be gradually increased in a direction from the first fluid channel to the dispensing end.

According to an embodiment, the first fluid channel may include an upper fluid channel, wherein an area of a cross-section perpendicular to a lengthwise direction of the upper fluid channel is constant and a lower fluid channel extending from the upper fluid channel, wherein an area of a cross-section perpendicular to a lengthwise direction of the lower fluid channel is gradually decreased. A lower end of the lower fluid channel may be disposed downstream of an upper end of the second fluid channel.

According to an embodiment, the upper end of the second fluid channel may be in agreement with an upper end of the lower fluid channel.

According to an embodiment, the lower fluid channel may have an funnel shape, and a central axis of the lower fluid channel may be in agreement with the central axis of the first fluid channel and the central axis of the second fluid channel.

According to an embodiment, an angle formed by a portion where the lower fluid channel and the second fluid channel adjoin each other may be an acute angle, when a vertical section of the lower fluid channel is viewed.

According to an embodiment, the second fluid channel may have an arc shape, and the center of the arc may be on the central axis of the first fluid channel.

According to an embodiment, a central angle of the arc may be an acute angle.

According to an embodiment, the dispensing end may have a rounded shape that is convex toward a direction in which the first processing liquid is dispensed.

According to an embodiment, the liquid dispensing unit may further include a second nozzle that dispenses a second processing liquid different from the first processing liquid and a third nozzle that dispenses the first processing liquid that is the same as the first processing liquid dispensed by the first nozzle. The second nozzle and the third nozzle may dispense the second processing liquid and the first processing liquid in a manner of a stream, respectively. The first processing liquid may be a chemical, and the second processing liquid may be deionized water.

According to an embodiment, the first nozzle may dispense the first processing liquid onto a top side of the substrate, which is supported on the support unit, in an oblique direction.

According to an exemplary embodiment, a nozzle for dispensing a processing liquid to treat a substrate includes a first fluid channel that is formed in the nozzle and through which the processing liquid flows and a second fluid channel in communication with the first fluid channel, the second fluid channel being connected to a dispensing end of the nozzle. The second fluid channel has a larger width than the first fluid channel, and a central axis of the first fluid channel and a central axis of the second fluid channel are connected with each other in a straight line.

According to an embodiment, the first fluid channel may have a circular cross-section that is perpendicular to a lengthwise direction of the first fluid channel, and the second fluid channel may have a slit-shaped cross-section that is perpendicular to a direction in which the processing liquid flows.

According to an embodiment, the width of the second fluid channel may be gradually increased in a direction from the first fluid channel to the dispensing end.

According to an embodiment, the first fluid channel may include an upper fluid channel, wherein an area of a cross-section perpendicular to a lengthwise direction of the upper fluid channel is constant and a lower fluid channel extending from the upper fluid channel, wherein an area of a cross-section perpendicular to a lengthwise direction of the lower fluid channel is gradually decreased. A lower end of the lower fluid channel may be disposed downstream of an upper end of the second fluid channel.

According to an embodiment, the upper end of the second fluid channel may be in agreement with an upper end of the lower fluid channel.

According to an embodiment, the lower fluid channel may have an funnel shape, and a central axis of the lower fluid channel may be in agreement with the central axis of the first fluid channel and the central axis of the second fluid channel.

According to an embodiment, an angle formed by a portion where the lower fluid channel and the second fluid channel adjoin each other may be an acute angle, when a vertical section of the lower fluid channel is viewed.

According to an embodiment, the second fluid channel may have an arc shape, and the center of the arc may be on the central axis of the first fluid channel.

According to an embodiment, a central angle of the arc may be an acute angle.

According to an embodiment, the dispensing end may have a rounded shape that is convex toward a direction in which the processing liquid is dispensed.

According to an exemplary embodiment, in a method for machining the nozzle, the first fluid channel is formed by performing a drilling operation at an upper end of the nozzle in the direction in which the processing liquid flows, and the second fluid channel is formed by performing a slit machining operation at the dispensing end in a direction opposite to the direction in which the first fluid channel is formed.

According to an embodiment, the slit machining operation may be performed up to an end from which the lower fluid channel starts.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
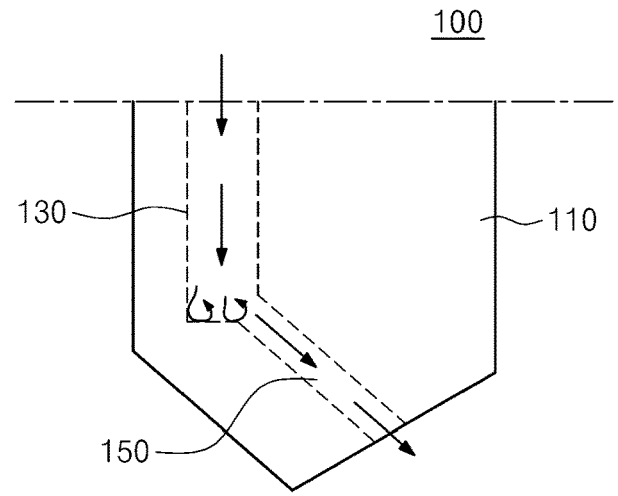
FIG. 1 is a sectional view of a conventional liquid dispensing nozzle for dispensing a developing solution.
Figure 2:
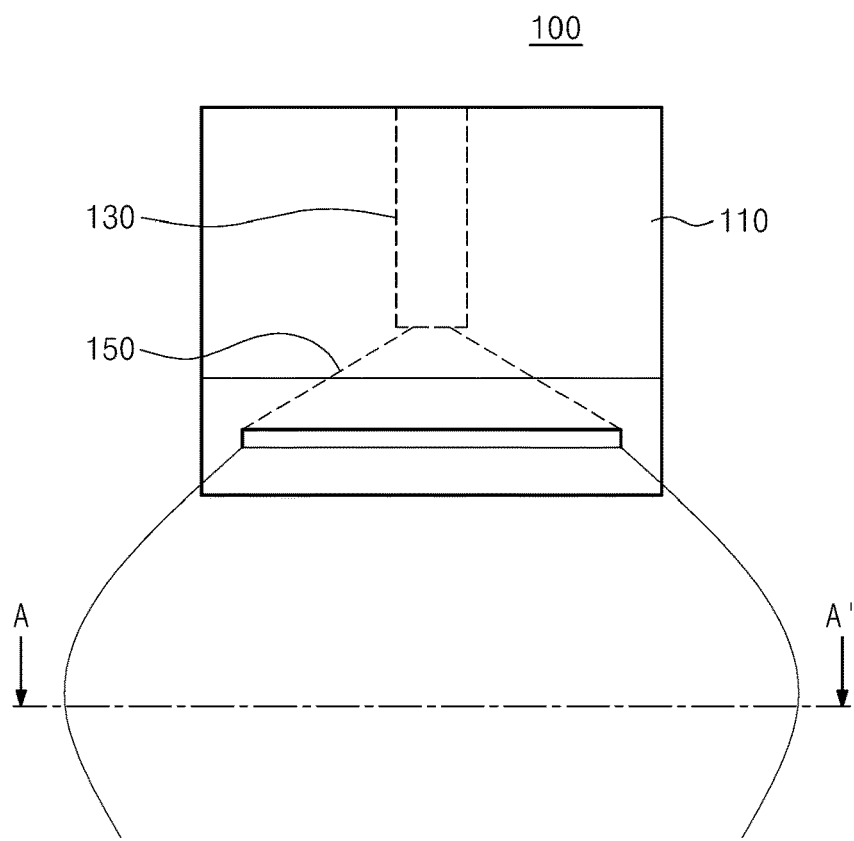
FIG. 2 is a view illustrating a state in which the liquid dispensing nozzle of FIG. 1 dispenses a developing solution.
Figure 3:
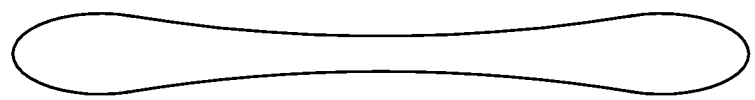
FIG. 3 is a sectional view taken along line A-A' of FIG. 2.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Figure 4:
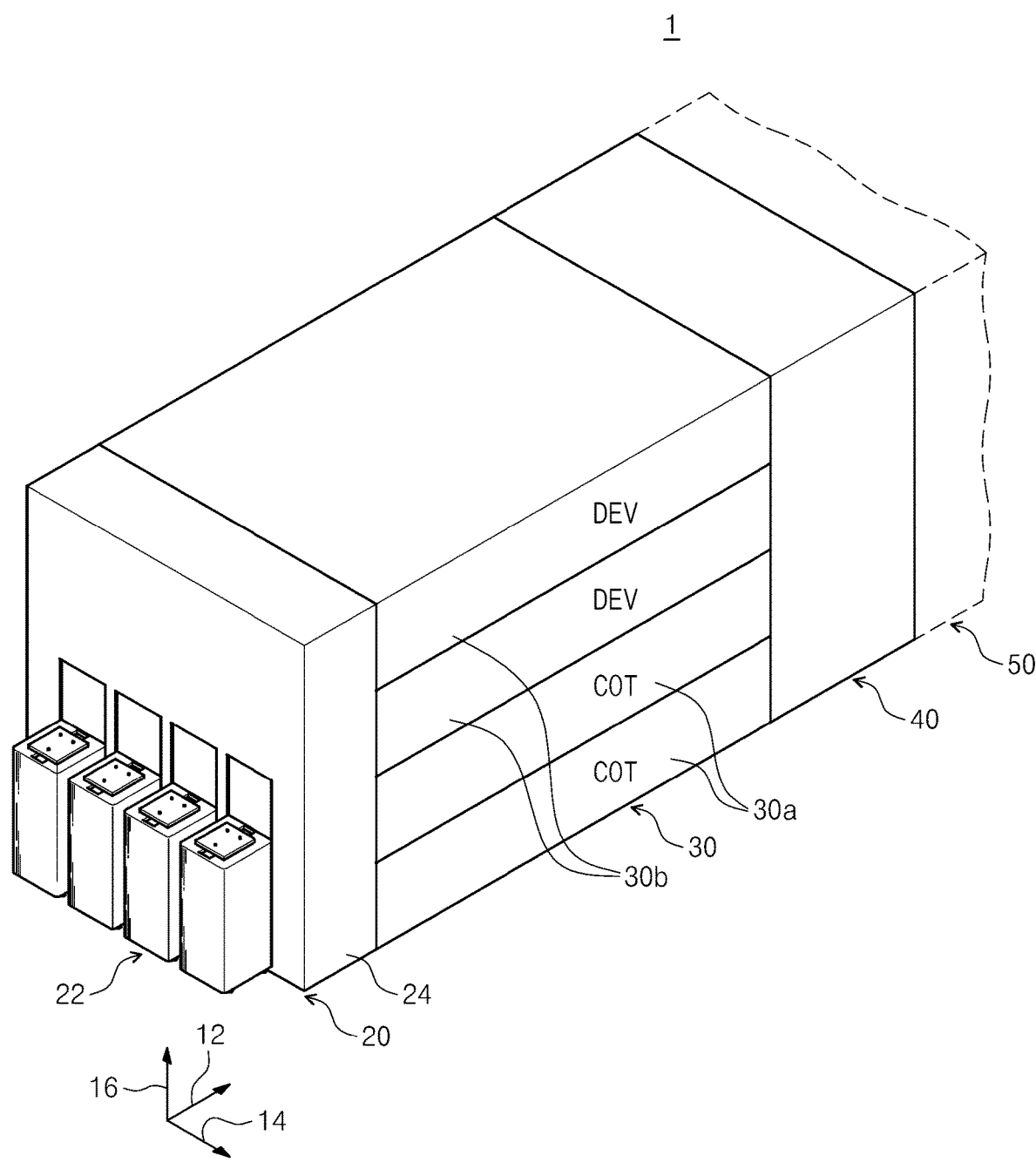
FIG. 4 is a schematic perspective view illustrating a substrate treating apparatus according to an embodiment of the inventive concept.
Figure 5:
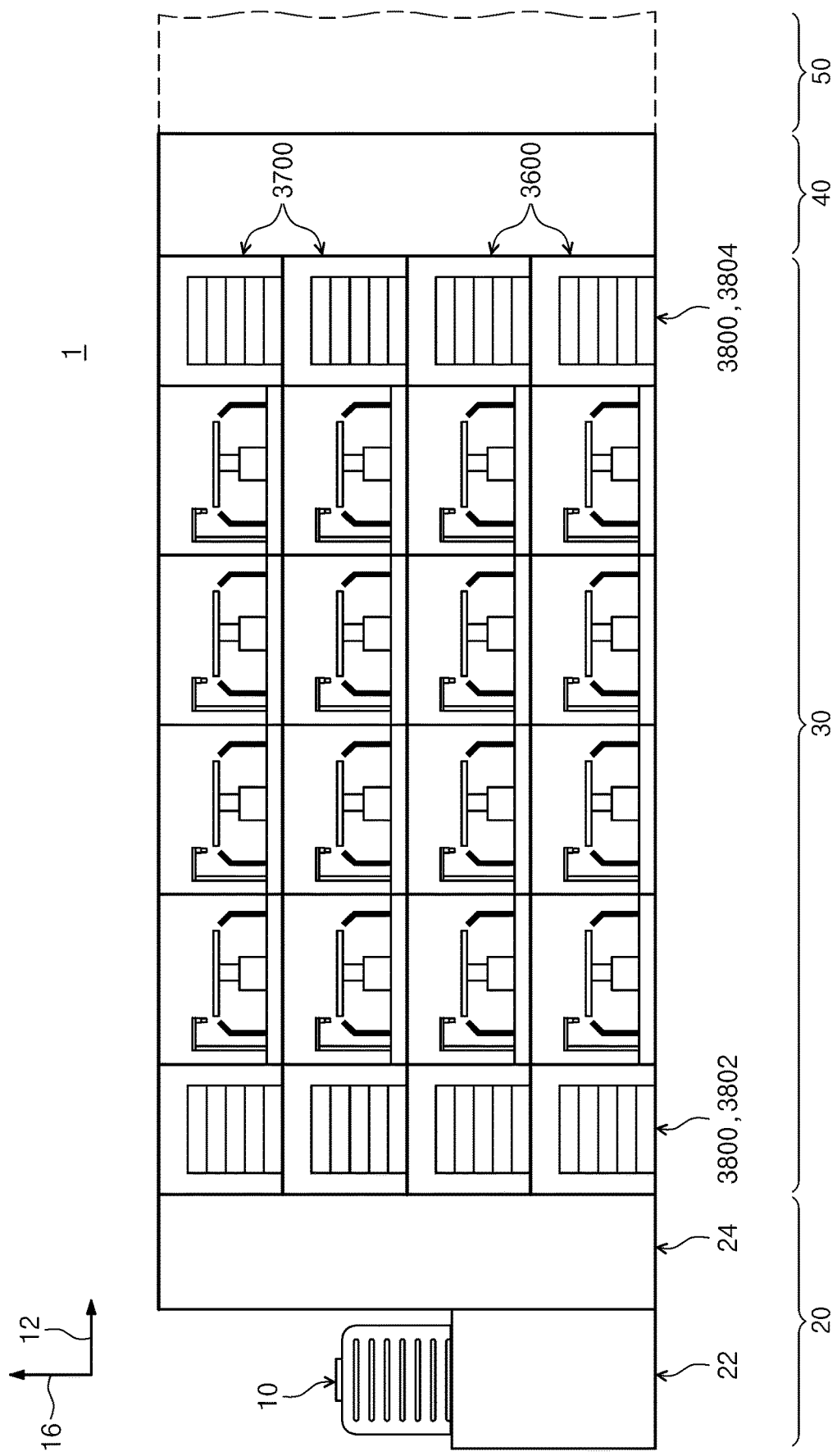
FIG. 5 is a sectional view of the substrate treating apparatus illustrating coating blocks and developing blocks of FIG. 4.
Figure 6:
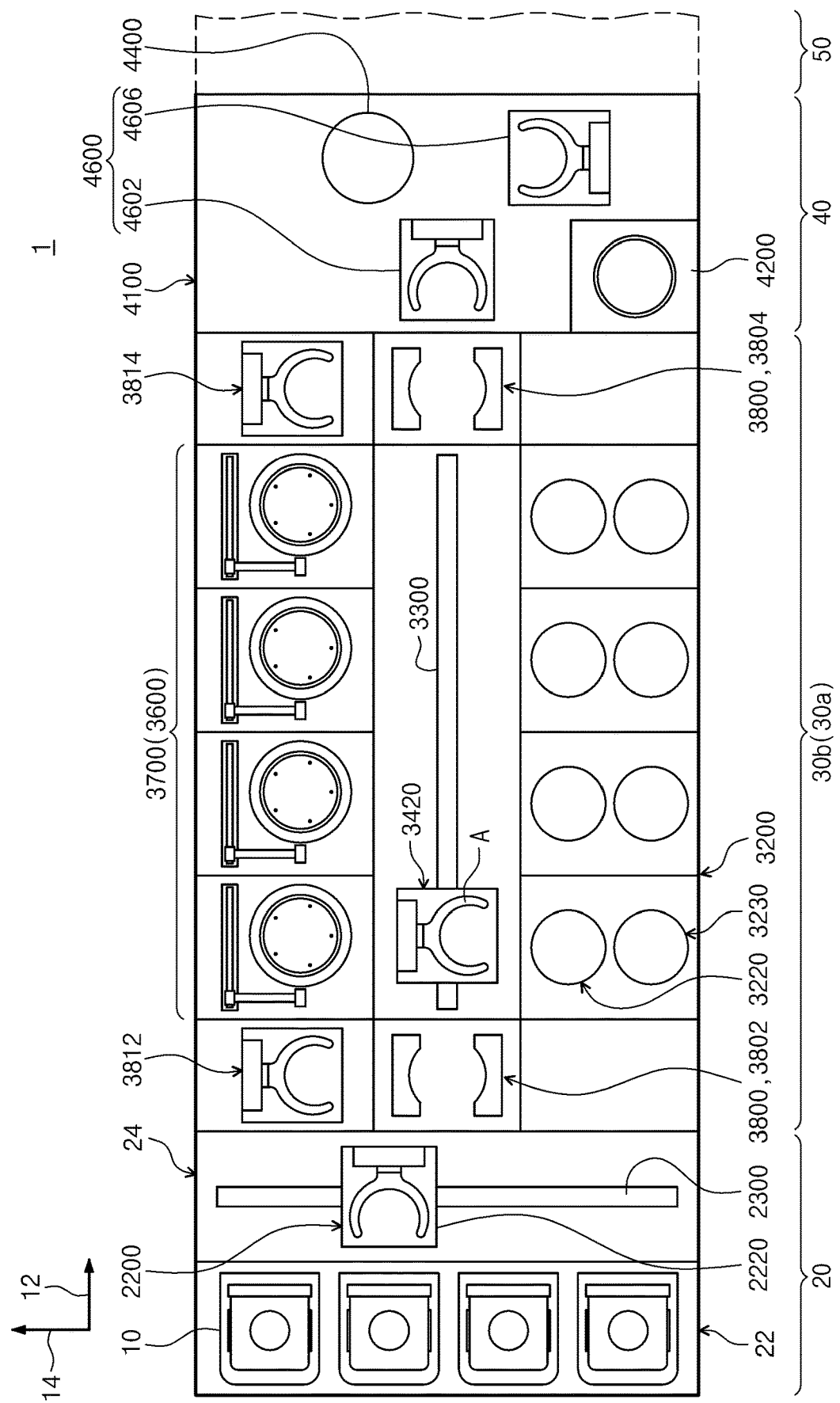
FIG. 6 is a plan view illustrating the substrate treating apparatus of FIG. 4.

FIG. 4 is a schematic perspective view illustrating a substrate treating apparatus according to an embodiment of the inventive concept. FIG. 5 is a sectional view of the substrate treating apparatus illustrating coating blocks and developing blocks of FIG. 4. FIG. 6 is a plan view illustrating the substrate treating apparatus of FIG. 4.

Referring to FIGS. 4 to 6, the substrate treating apparatus 1 includes an index module 20, a treating module 30, and an interface module 40. According to an embodiment, the index module 20, the treating module 30, and the interface module 40 are sequentially arranged in a row. Hereinafter, the direction in which the index module 20, the treating module 30, and the interface module 40 are arranged is referred to as an X-axis direction 12, a direction perpendicular to the X-axis direction 12 when viewed from above is referred to as a Y-axis direction 14, and a direction perpendicular to both the X-axis direction 12 and the Y-axis direction 14 is referred to as a Z-axis direction 16.

The index module 20 transfers substrates W from carriers 10 having the substrates W received therein to the treating module 30 and places completely treated substrates W in the carriers 10. The lengthwise direction of the index module 20 is parallel to the Y-axis direction 14. The index module 20 has load ports 22 and an index frame 24. The load ports 22 are located on the opposite side to the treating module 30 with respect to the index frame 24. The carriers 10 having the substrates W received therein are placed on the load ports 22. The load ports 22 may be arranged along the Y-axis direction 14.

Airtight containers 10 such as front open unified pods (FOUPs) may be used as the carriers 10. The carriers 10 may be placed on the load ports 22 by a transfer means (not illustrated) such as an overhead transfer, an overhead conveyor, or an automatic guided vehicle, or by a worker.

An index robot 2200 is provided in the index frame 24. A guide rail 2300, the lengthwise direction of which is parallel to the Y-axis direction 14, is provided in the index frame 24. The index robot 2200 is movable on the guide rail 2300. The index robot 2200 includes hands 2220 on which the substrates W are placed, and the hands 2220 are movable forward and backward, rotatable about an axis oriented in the Z-axis direction 16, and movable along the Z-axis direction 16.

The treating module 30 performs a coating process and a developing process on the substrates W. The treating module 30 has coating blocks 30a and developing blocks 30b. The coating blocks 30a perform the coating process on the substrates W, and the developing blocks 30b perform the developing process on the substrates W. The coating blocks 30a are stacked on each other. The developing blocks 30b are stacked on each other. According to the embodiment of FIG. 4, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIG. 6, each of the coating blocks 30a has heat treatment chambers 3200, a transfer chamber 3400, coating chambers 3600, and buffer chambers 3800. Each of the heat treatment chambers 3200 performs a heat treatment process on a substrate W. The heat treatment process may include a cooling process and a heating process. Each of the coating chambers 3600 forms a liquid film on the substrate W by dispensing a liquid onto the substrate W. The liquid film may be a photoresist film or an anti-reflection film. The transfer chamber 3400 transfers the substrate W between the heat treatment chamber 3200 and the coating chamber 3600 in the coating block 30a.

Each of the developing blocks 30a has heat treatment chambers 3200, a transfer chamber 3400, developing chambers 3700, and buffer chambers 3800. Each of the heat treatment chambers 3200 performs a heat treatment process on a substrate W. The heat treatment process may include a cooling process and a heating process. Each of the developing chambers 3700 performs a developing process of removing part of a photoresist film by dispensing a developing solution to obtain a pattern on the substrate W. For example, the developing chamber 3700 may remove light-exposed regions of the photoresist on the substrate W. At this time, light-exposed regions of a protective film are also removed. Alternatively, depending on the type of photoresist used, only masked regions of the photoresist and the protective film may be removed. Thereafter, the developing chamber 3700 performs a heat treatment process on the substrate W. The transfer chamber 3400 transfers the substrate W between the heat treatment chamber 3200 and the developing chamber 3700 in the developing block 30b.

The transfer chamber 3400 is arranged such that the lengthwise direction thereof is parallel to the X-axis direction 12. A transfer unit 3420 is provided in the transfer chamber 3400. The transfer unit 3420 transfers the substrate W between the heat treatment chamber 3200, the coating chamber 3600, and the buffer chambers 3800. According to an embodiment, the transfer unit 3420 has a hand A on which the substrate W is placed, and the hand A is movable forward and backward, rotatable about an axis oriented in the Z-axis direction 16, and movable along the Z-axis direction 16. A guide rail 3300, the lengthwise direction of which is parallel to the X-axis direction 12, is provided in the transfer chamber 3400. The transfer unit 3420 is movable on the guide rail 3300.

Figure 7:
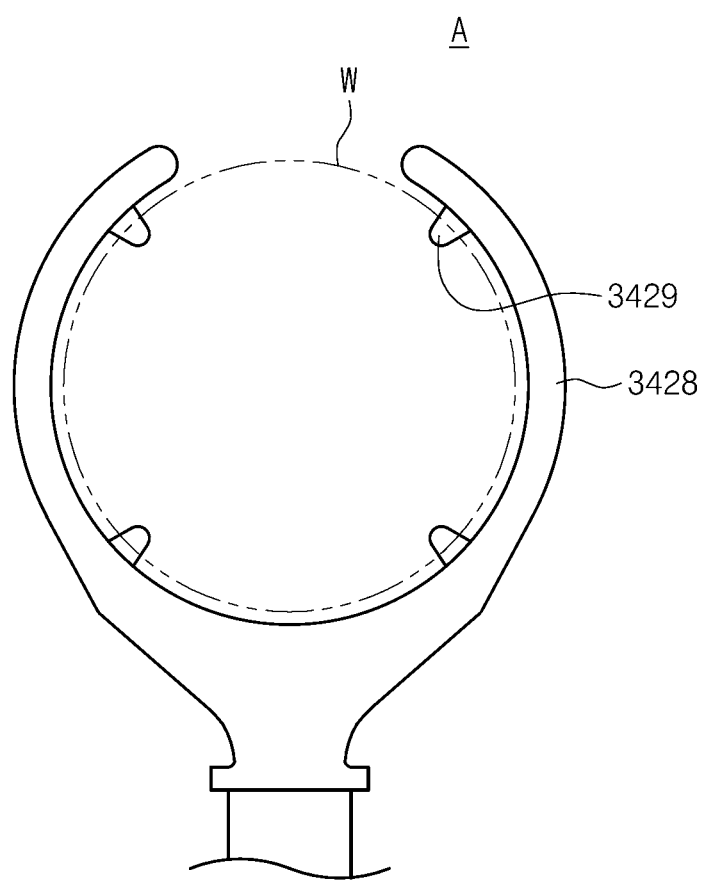
FIG. 7 is a view illustrating an example of a hand of a transfer unit of FIG. 6.

FIG. 7 is a view illustrating an example of the hand of the transfer unit of FIG. 6. Referring to FIG. 7, the hand A has a base 3428 and support protrusions 3429. The base 3428 may have an annular ring shape with a partly curved circumference. The base 3428 has an inner diameter larger than the diameter of the substrate W. The support protrusions 3429 extend inward from the base 3428. The support protrusions 3429 support the edge region of the substrate W. According to an embodiment, four support protrusions 3429 may be provided at equal intervals.

Referring again to FIGS. 5 and 6, the plurality of heat treatment chambers 3200 are provided. The heat treatment chambers 3200 are arranged along the X-axis direction 12. The heat treatment chambers 3200 are located on one side of the transfer chamber 3400.

Figure 8:
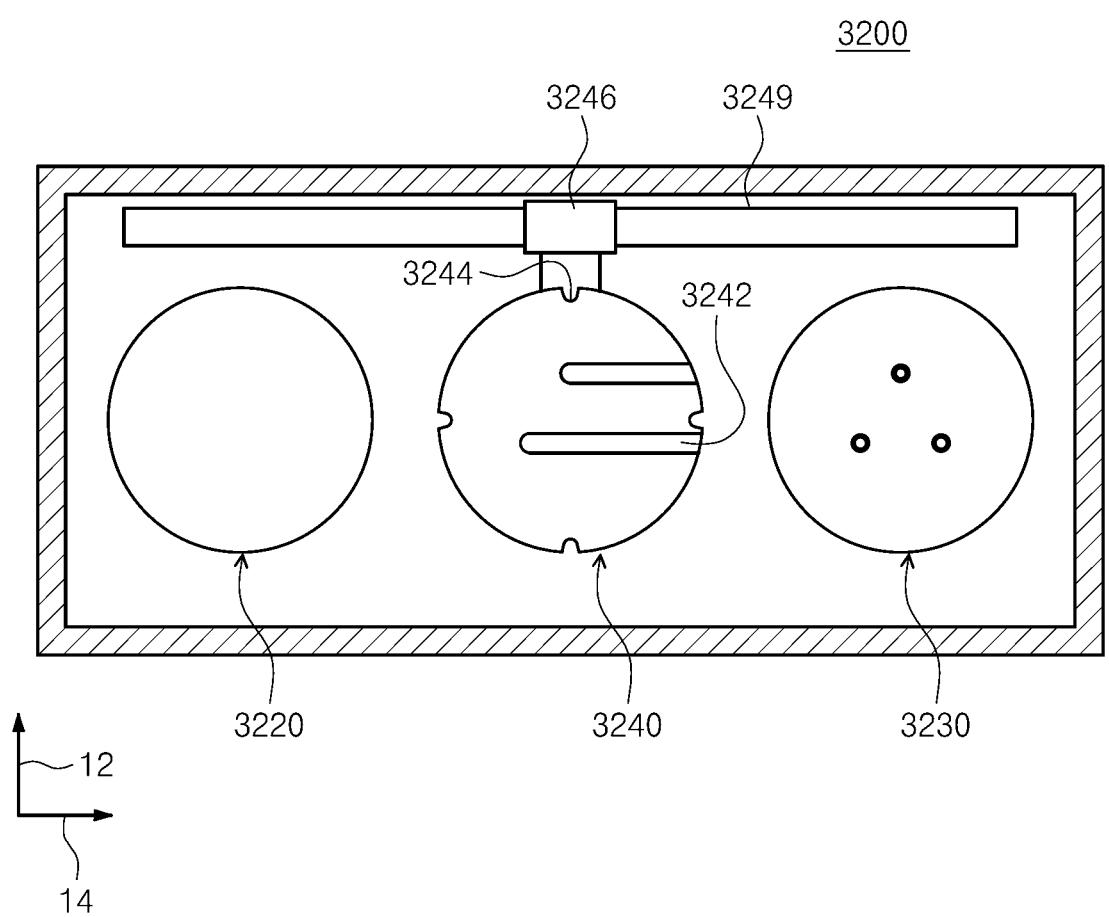
FIG. 8 is a schematic horizontal sectional view illustrating an example of heat treatment chambers of FIG. 6.
Figure 9:
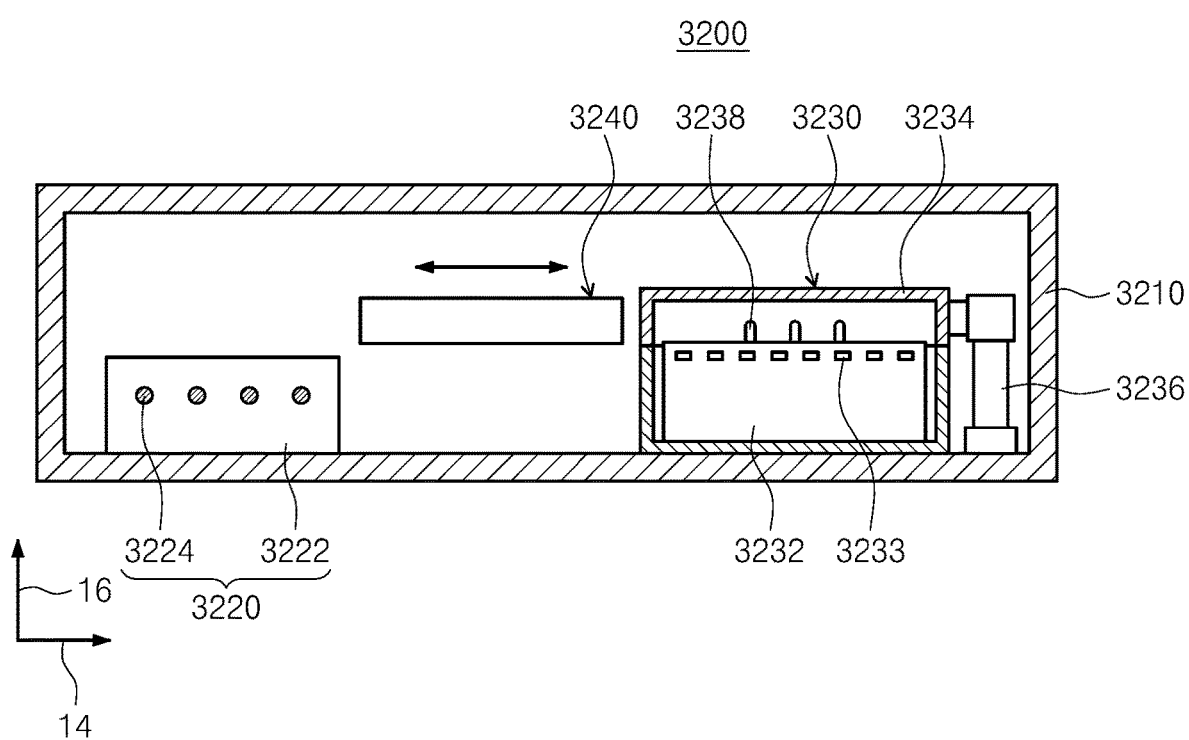
FIG. 9 is a front sectional view illustrating the heat treatment chamber of FIG. 8.

FIG. 8 is a schematic horizontal sectional view illustrating an example of the heat treatment chambers of FIG. 6, and FIG. 9 is a front sectional view illustrating the heat treatment chamber of FIG. 8. The heat treatment chamber 3200 has a housing 3210, a cooling unit 3220, a heating unit 3230, and a transfer plate 3240.

The housing 3210 has a substantially rectangular parallelepiped shape. The housing 3210 has, in a sidewall thereof, an entrance (not illustrated) through which the substrate W is loaded into or unloaded from the housing 3210. The entrance may remain open. Alternatively, a door (not illustrated) for opening or closing the entrance may be provided. The cooling unit 3220, the heating unit 3230, and the transfer plate 3240 are provided in the housing 3210. The cooling unit 3220 and the heating unit 3230 are provided side by side along the Y-axis direction 14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. The cooling plate 3222 has a cooling member 3224 therein. According to an embodiment, the cooling member 3224 may be formed in the cooling plate 3222 and may serve as a fluid channel through which a cooling fluid flows.

The heating unit 3230 has a heating plate 3232, a cover 3234, and a heater 3233. The heating plate 323 has a substantially circular shape when viewed from above. The heating plate 3232 has a larger diameter than the substrate W. The heating plate 3232 is equipped with the heater 3233. The heater 3233 may be a resistance heating element to which electric current is applied. The heating plate 3232 has lift pins 3238 that are vertically movable along the Z-axis direction 16. The lift pins 3238 receive the substrate W from a transfer unit outside the heating unit 3230 and lay the substrate W down on the heating plate 3232, or raise the substrate W off the heating plate 3232 and transfer the substrate W to the transfer unit outside the heating unit 3230. According to an embodiment, three lift pins 3238 may be provided. The cover 3234 has a space therein, which is open at the bottom. The cover 3234 is located over the heating plate 3232 and vertically moved by an actuator 3236. When the cover 3234 is brought into contact with the heating plate 3232, the space surrounded by the cover 3234 and the heating plate 3232 serves as a heating space in which the substrate W is heated.

The transfer plate 3240 has a substantially circular plate shape and has a diameter corresponding to that of the substrate W. The transfer plate 3240 has notches 3244 formed at the edge thereof. The notches 3244 may have a shape corresponding to the shape of the protrusions 3429 formed on the hand A of the transfer unit 3420 described above. Furthermore, as many notches 3244 as the protrusions 3429, which are formed on the hand A, are formed in positions corresponding to the protrusions 3429. The substrate W is transferred between the hand A and the transfer plate 3240 when the vertical positions of the hand A and the transfer plate 3240 aligned with each other in the vertical direction are changed. The transfer plate 3240 is mounted on a guide rail 3249 and moved along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the Y-axis direction 14, and the guide grooves 3242 are spaced apart from each other along the X-axis direction 12. The guide grooves 3242 prevent the transfer plate 3240 and the lift pins 3238 from interfering with each other when the substrate W is transferred between the transfer plate 3240 and the heating unit 3230.

The substrate W is heated in the state in which the substrate W is directly placed on the heating plate 3232. The substrate W is cooled in the state in which the transfer plate 3240 on which the substrate W is placed is brought into contact with the cooling plate 3222. The transfer plate 3240 is formed of a material with a high heat transfer rate to efficiently transfer heat between the cooling plate 3222 and the substrate W. According to an embodiment, the transfer plate 3240 may be formed of metal.

Heating units 3230 provided in some of the heat treatment chambers 3200 may improve adhesion of photoresist to a substrate W by supplying a gas while heating the substrate W. According to an embodiment, the gas may be a hexamethyldisilane gas.

Referring again to FIGS. 5 and 6, the plurality of coating chambers 3600 and the plurality of developing chambers 3700 are provided. Some of the coating chambers 3600 and the developing chambers 3700 may be stacked one above another. The coating chambers 3600 and the developing chambers 3700 are disposed on one side of the transfer chamber 3420. The coating chambers 3600 and the developing chambers 3700 are arranged side by side along the X-axis direction 12.

The plurality of buffer chambers 3800 are provided. Some of the buffer chambers 3800 are disposed between the index module 20 and the transfer chamber 3400. Hereinafter, these buffer chambers are referred to as the front buffers 3802. The front buffers 3802 are stacked one above another along the vertical direction. The other buffer chambers are disposed between the transfer chamber 3400 and the interface module 40. Hereinafter, these buffer chambers are referred to as the rear buffers 3804. The rear buffers 3804 are stacked one above another along the vertical direction. The front buffers 3802 and the rear buffers 3804 temporarily store a plurality of substrates W. The substrates W stored in the front buffers 3802 are extracted by the index robot 2200 and the transfer unit 3420. The substrates W stored in the rear buffers 3804 are extracted by the transfer unit 3420 and a first robot 4602.

The interface module 40 connects the treating module 30 with an external stepper 50. The interface module 40 has an interface frame 4100, an additional process chamber 4200, an interface buffer 4400, and a transfer member 4600.

The interface frame 4100 may have, at the top thereof, a fan filter unit that forms a downward flow of air in the interface frame 4100. The additional process chamber 4200, the interface buffer 4400, and the transfer member 4600 are disposed in the interface frame 4100. The additional process chamber 4200 may perform a predetermined additional process on a substrate W processed in the coating block 30a before the substrate W is transferred to the stepper 50. Alternatively, the additional process chamber 4200 may perform a predetermined additional process on a substrate W processed in the stepper 50 before the substrate W is transferred to the developing block 30b. According to an embodiment, the additional processes may be an edge exposing process of exposing the edge region of the substrate W to light, a top-side cleaning process of cleaning the top side of the substrate W, or a back-side cleaning process of cleaning the backside of the substrate W. A plurality of additional process chambers 4200 may be provided. The additional process chambers 4200 may be stacked one above another. The additional process chambers 4200 may all perform the same process. Alternatively, some of the additional process chambers 4200 may perform different processes.

The interface buffer 4400 provides a space in which substrates W transferred between the coating block 30a, the additional process chambers 4200, the stepper 50, and the developing block 30b temporarily stay. A plurality of interface buffers 4400 may be provided. The interface buffers 4400 may be stacked one above another.

According to an embodiment, the additional process chambers 4200 may be disposed on one side of an extension line oriented in the lengthwise direction of the transfer chamber 3400, and the interface buffers 4400 may be disposed on an opposite side of the extension line.

The transfer member 4600 transfers substrates W between the coating block 30a, the additional process chambers 4200, the stepper 50, and the developing block 30b. The transfer member 4600 may be implemented with one or more robots. According to an embodiment, the transfer member 4600 has the first robot 4602 and a second robot 4606. The first robot 4602 may transfer substrates W between the coating block 30a, the additional process chambers 4200, and the interface buffers 4400. An interface robot may transfer substrates W between the interface buffers 4400 and the stepper 50. The second robot 4606 may transfer substrates W between the interface buffers 4400 and the developing block 30b.

The first robot 4602 and the second robot 4606 each include a hand on which a substrate W is placed, and the hand is movable forward and backward, rotatable about an axis parallel to the Z-axis direction 16, and movable along the Z-axis direction 16.

Figure 10:
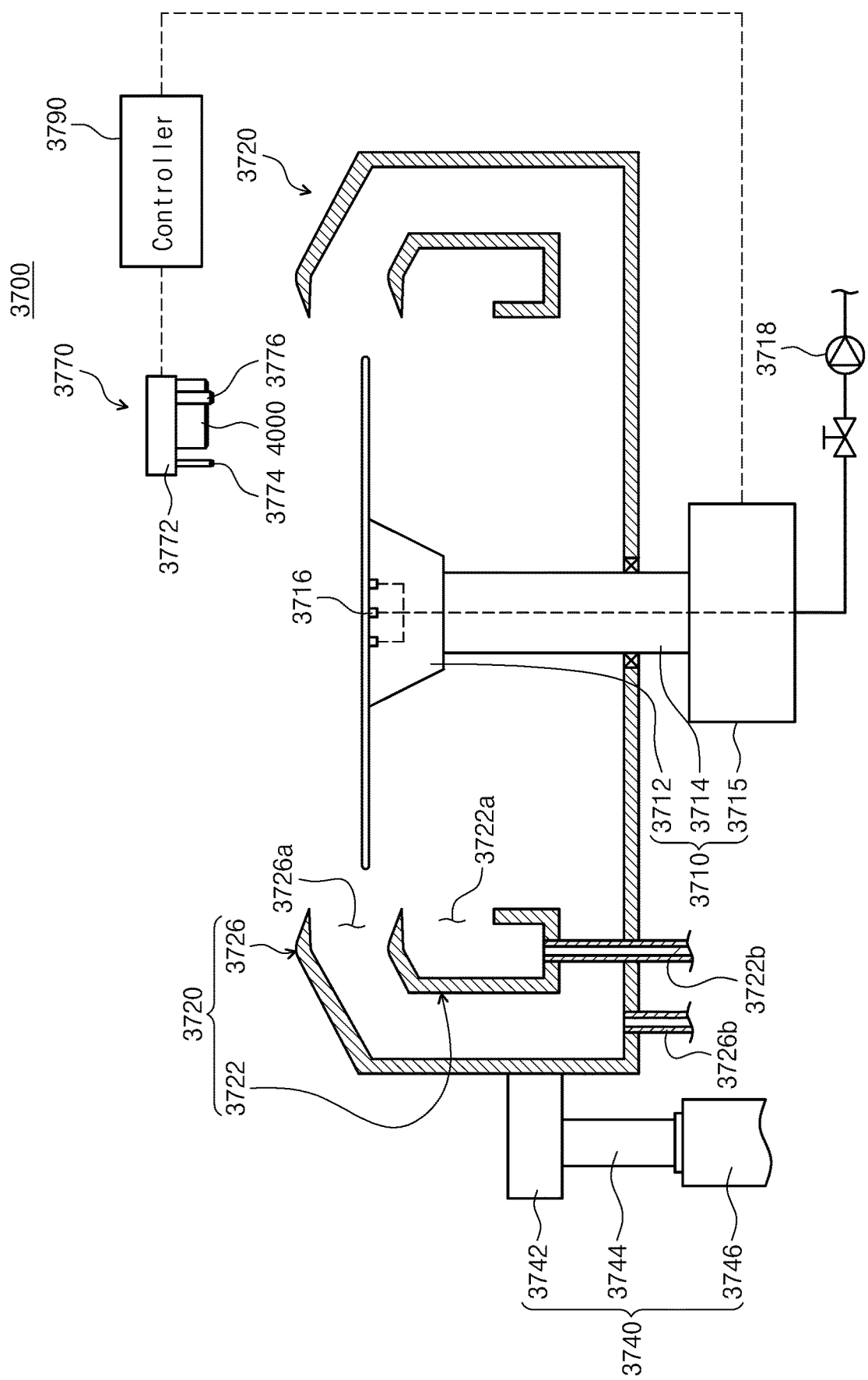
FIG. 10 is a sectional view illustrating a developing chamber of FIG. 5.
Figure 11:
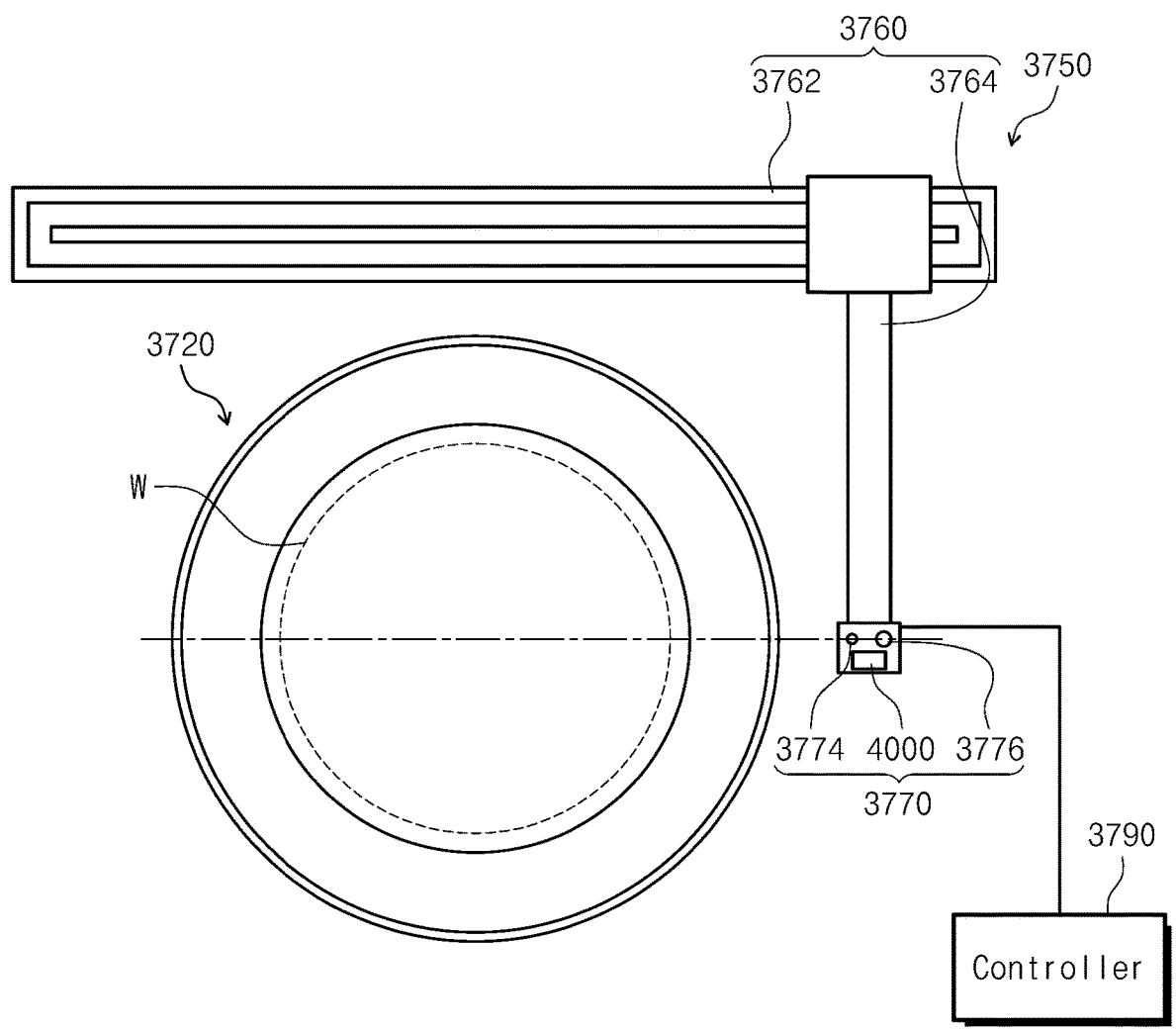
FIG. 11 is a plan view illustrating the developing chamber of FIG. 10.

Hereinafter, the developing chamber 3700 according to an embodiment of the inventive concept will be described. FIG. 10 is a sectional view illustrating the developing chamber of FIG. 5, and FIG. 11 is a plan view illustrating the developing chamber of FIG. 10. Referring to FIGS. 10 and 11, the developing chamber 3700 includes a support unit 3710, a processing vessel 3720, a lifting unit 3740, a liquid dispensing unit 3750, and a controller 3790.

The support unit 3710 supports and rotates a substrate W. The support unit 3710 includes a support plate 3712, a rotary drive member 3714, 3715, and a vacuum member 3718. The support plate 3712 supports the substrate W. The support plate 3712 has a circular plate shape. An upper surface of the support plate 3712 may have a larger diameter than a bottom surface of the support plate 3712. A side surface of the support plate 3712 that connects the upper surface and lower surface of the support plate 3712 may be downwardly inclined toward the central axis of the support plate 3712. The upper surface of the support plate 3712 serves as a seating surface on which the substrate W is seated. The seating surface has a smaller area than the substrate W. The seating surface supports the central region of the substrate W. A plurality of suction holes 3716 are formed in the seating surface. The suction holes 3716 may be holes for clamping the substrate W to the seating surface by vacuum pressure. The vacuum member 3718 is connected to the suction holes 3716. According to an embodiment, the diameter of the seating surface may be smaller than the radius of the substrate W. The vacuum member 3718 may be a pump for evacuating the suction holes 3716.

The rotary drive member 3714, 3715 rotates the support plate 3712. The rotary drive member 3714, 3715 includes a rotary shaft 3714 and an actuator 3715. The rotary shaft 3714 has a cylindrical shape, the lengthwise direction of which is oriented in the vertical direction. The rotary shaft 3714 is coupled to the bottom surface of the support plate 3712. The actuator 3715 transmits rotary power to the rotary shaft 3714. The rotary shaft 3714 is rotatable about the central axis thereof by the rotary power transmitted from the actuator 3715. The support plate 3712 is rotatable together with the rotary shaft 3714. The rotational speed of the rotary shaft 3714 is adjusted by the actuator 3715 to adjust the rotational speed of the substrate W. For example, the actuator 3715 may be a motor.

The processing vessel 3720 has a process space therein, in which a developing process and a bake process are performed. The processing vessel 3720 recovers liquids used in the developing process. Furthermore, the processing vessel 3720 may discharge fumes generated during the bake process. The processing vessel 3720 has a cup shape that is open at the top thereof. The processing vessel 3720 includes an inner recovery bowl 3722 and an outer recovery bowl 3726. The recovery bowls 3722 and 3726 recover different types of liquids used in a process. The inner recovery bowl 3722 has an annular ring shape that surrounds the support unit 3710, and the outer recovery bowl 3726 has an annular ring shape that surrounds the inner recovery bowl 3722. An interior space 3722a of the inner recovery bowl 3722 and a space 3726a between the outer recovery bowl 3726 and the inner recovery bowl 3722 function as inlets through which the liquids are introduced into the inner recovery bowl 3722 and the outer recovery bowl 3726, respectively. The recovery bowls 3722 and 3726 have recovery lines 3722b and 3726b connected thereto, which vertically extend downward from bottom surfaces of the recovery bowls 3722 and 3726. The recovery lines 3722b and 3726b separate and discharge the liquids introduced through the recovery bowls 3722 and 3726. The discharged liquids may be reused through an external processing liquid regeneration system (not illustrated).

The lifting unit 3740 adjusts the relative height between the processing vessel 3720 and the support unit 3710. For example, the lifting unit 3740 may move the processing vessel 3720 in the vertical direction. The lifting unit 3740 includes a bracket 3742, a movable shaft 3744, and an actuator 3746. The bracket 3742 connects the processing vessel 3720 and the movable shaft 3744. The bracket 3742 is fixedly attached to a vertical wall of the outer recovery bowl 3726 of the processing vessel 3720. The movable shaft 3744 is arranged such that the lengthwise direction thereof is parallel to the vertical direction. An upper end of the movable shaft 3744 is fixedly coupled to the bracket 3742. The movable shaft 3744 is moved in the vertical direction by the actuator 3746, and the processing vessel 3720 is raised or lowered together with the movable shaft 3744. For example, the actuator 3746 may be a cylinder or a motor.

The liquid dispensing unit 3750 dispenses the liquids onto the substrate W supported on the support unit 3710. The liquid dispensing unit 3750 includes a nozzle moving member 3760 and a nozzle unit 3770. The nozzle moving member 3760 moves the nozzle unit 3770 between a process position and a standby position. Here, the process position is a position in which the nozzle unit 3770 is opposite the substrate W in the vertical direction, and the standby position is a position distant from the process position. The nozzle moving member 3760 rectilinearly moves the nozzle unit 3770. According to an embodiment, the nozzle unit 3770 may be rectilinearly moved in the X-axis direction 12.

The nozzle moving member 3760 includes a guide rail 3762 and a support arm 3764. The guide rail 3762 is located on one side of the processing vessel 3720. The guide rail 3762 has a lengthwise direction parallel to the moving direction of the nozzle unit 3770. For example, the lengthwise direction of the guide rail 3726 may be parallel to the X-axis direction 12. The support arm has a bar shape. When viewed from above, the support arm 3764 has a lengthwise direction perpendicular to the guide rail 3762. For example, the lengthwise direction of the support arm 3764 may be parallel to the Y-axis direction 14. The nozzle unit 3770 is coupled to one end of the support arm 3764. An opposite end of the support arm 3764 is mounted on the guide rail 3762. Accordingly, the support arm 3764 and the nozzle unit 3770 are movable together along the lengthwise direction of the guide rail 3762.

Figure 12:
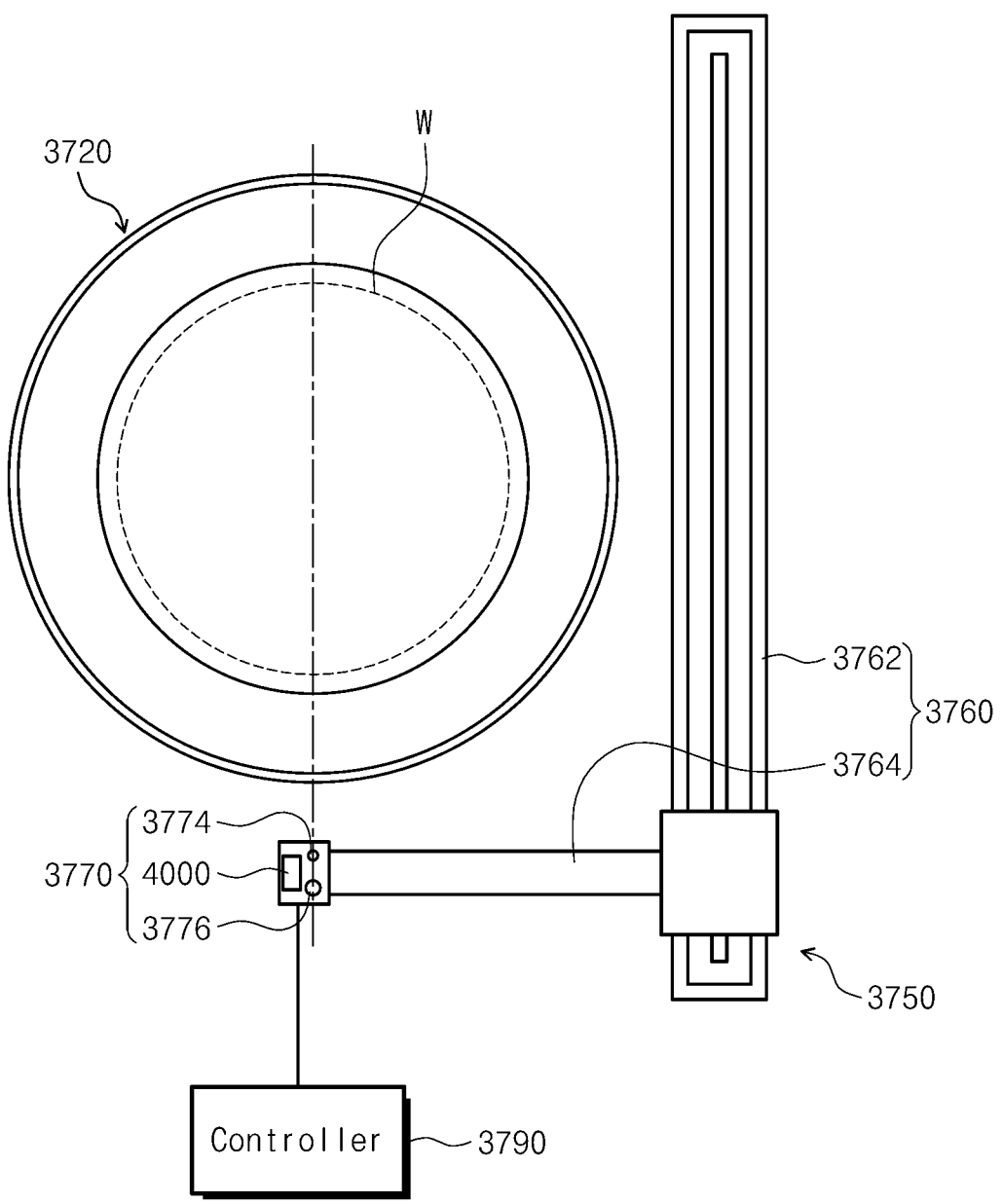
FIG. 12 is a plan view illustrating a developing chamber according to another embodiment.

In the above-described embodiment, it has been exemplified that the lengthwise direction of the guide rail 3762 is parallel to the X-axis direction 12 and the lengthwise direction of the support arm 3764 is parallel to the Y-axis direction 14. Without being limited thereto, however, as illustrated in FIG. 12, the guide rail 3762 may be arranged such that the lengthwise direction of the guide rail 3762 is parallel to the Y-axis direction 14, and the support arm 3764 may be arranged such that the lengthwise direction of the support arm 3764 is parallel to the X-axis direction 12.

Figure 13:
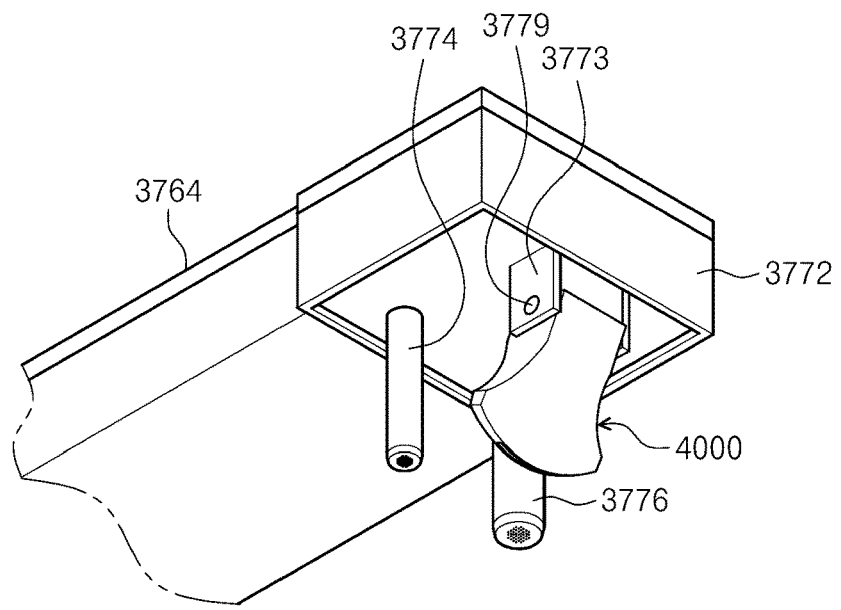
FIG. 13 is a perspective view illustrating a nozzle unit of FIG. 11.

FIG. 13 is a perspective view illustrating the nozzle unit of FIG. 11.

Referring to FIG. 13, the nozzle unit 3770 includes a body 3772 and liquid dispensing nozzles 4000, 3774, and 3776. The nozzle unit 3770 may dispense processing liquids.

The body 3772 supports the liquid dispensing nozzles 4000, 3774, and 3776. For example, the body 3772 supports the first nozzle 4000, the second nozzle 3774, and the third nozzle 3776. The body 3772 is fixedly coupled to a bottom surface of the one end of the support arm 3764. The first nozzle 4000, the second nozzle 3774, and the third nozzle 3776 may be coupled to the bottom surface of the body 3772.

The first nozzle 4000 may be coupled to a protrusion 3773 of the body 3772 that extends from a distal end of the body 3772 in the Z-axis direction 16. For example, the first nozzle 4000 may be fixedly coupled to the protrusion 3773 by a separate coupling member 3779 of the first nozzle 4000. Alternatively, the first nozzle 4000 may be rotatably coupled to the protrusion 3773 such that the processing liquid dispensing angle of the first nozzle 4000 is adjustable.

The first nozzle 4000 dispenses a processing liquid in the manner of a liquid curtain. For example, the first nozzle 4000 may dispense a first processing liquid. The first processing liquid may be a chemical. For example, the first processing liquid may be a developing solution. The first nozzle 4000 has a slit-shaped dispensing opening. The slit-shaped dispensing opening may have a lengthwise direction parallel to the guide rail 3762. The slit-shaped dispensing opening may have a lengthwise direction parallel to the X-axis direction 12. The slit-shaped dispensing opening may be oriented in a downwardly inclined direction. Accordingly, the first nozzle 400 may dispense the processing liquid onto the top side of the substrate W, which is supported on the support unit 3710, in the oblique direction. For example, the first nozzle 4000 may be downwardly inclined to dispense the liquid onto the same point together with the third nozzle 3776. The slit-shaped dispensing opening may have a length smaller than the radius of the substrate W. For example, the slit-shaped dispensing opening may be downwardly inclined toward the third nozzle 3776 from the first nozzle 4000. The first nozzle 4000 may be located on one side of the third nozzle 3776. The first nozzle 4000 may be located to be opposite the third nozzle 3776. When viewed from above, the first nozzle 4000 and the third nozzle 3776 may be arranged along the Y-axis direction 14.

The second nozzle 3774 may dispense a processing liquid in the manner of a stream. For example, the processing liquid may be a second processing liquid different from the first processing liquid. The second processing liquid may be a rinsing solution. The rinsing solution may be deionized water (DIW). The second nozzle 3774 may be located adjacent to the first nozzle 4000 and the third nozzle 3776. When viewed from above, the second nozzle 3774 and the first nozzle 4000 may be arranged along the X-axis direction 12. The second nozzle 3774 may have a stream dispensing opening in a circular shape. The stream dispensing opening may be oriented in the vertical downward direction.

The third nozzle 3776 may dispense a processing liquid in the manner of a stream. The third nozzle 3776 may dispense the processing liquid onto the same point together with the first nozzle 4000. The third nozzle 3776 may have a stream dispensing opening in a circular shape. The stream dispensing opening may be oriented in the vertical downward direction. The first nozzle 4000 and the third nozzle 3776 may dispense the same type of processing liquid. For example, the third nozzle 3776 may dispense the first processing liquid. The first processing liquid may be a chemical. The first processing liquid may be a developing solution.

Figure 14:
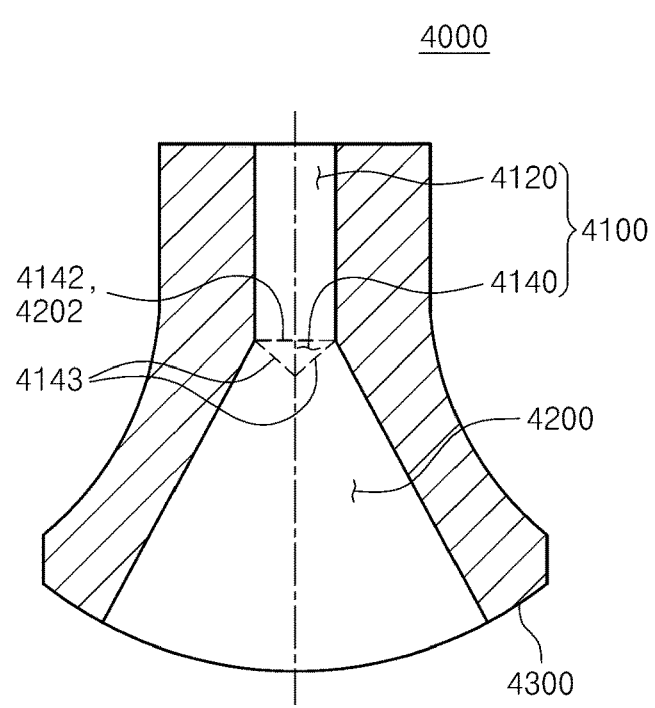
FIG. 14 is a front sectional view of a first nozzle among liquid dispensing nozzles of FIG. 13.
Figure 15:
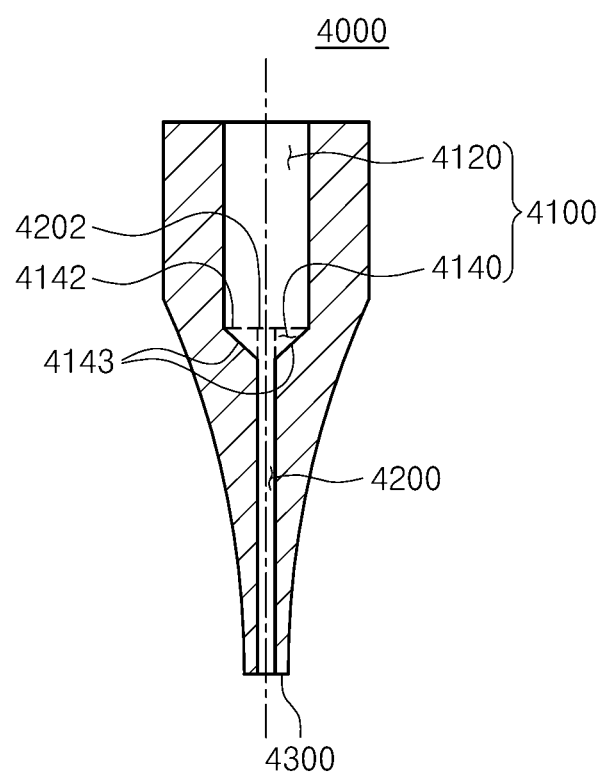
FIG. 15 is a side sectional view of the first nozzle among the liquid dispensing nozzles of FIG. 13.
Figure 16:
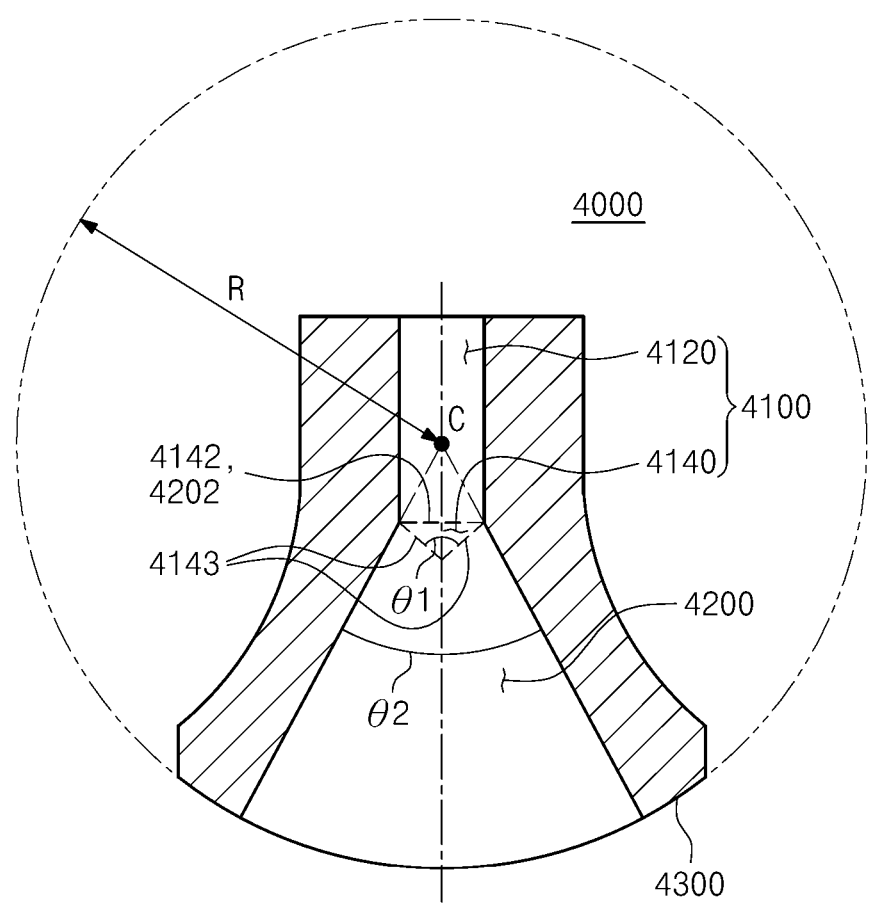
FIG. 16 is a front sectional view illustrating the structure of a second fluid channel and a dispensing end of the first nozzle among the liquid dispensing nozzles of FIG. 13.

FIG. 14 is a front sectional view of the first nozzle among the liquid dispensing nozzles of FIG. 13. FIG. 15 is a side sectional view of the first nozzle among the liquid dispensing nozzles of FIG. 13. FIG. 16 is a front sectional view illustrating the structure of a second fluid channel and a dispensing end of the first nozzle among the liquid dispensing nozzles of FIG. 13. Referring to FIGS. 14 to 16, the first nozzle 4000 may include a first fluid channel 4100, a second fluid channel 4200, and a dispensing end 4300.

The first fluid channel 4100 is formed in the first nozzle 4000 and is a fluid channel through which a processing liquid flows. The first fluid channel 4100 may have a circular cross-section that is perpendicular to the lengthwise direction of the first fluid channel 4100.

The first fluid channel 4100 may include an upper fluid channel 4120 and a lower fluid channel 4140. The area of the cross-section perpendicular to the lengthwise direction of the upper fluid channel 4120 may be constant. The lower fluid channel 4140 may extend from the upper fluid channel 4120, and the area of the cross-section perpendicular to the lengthwise direction of the lower fluid channel 4140 may be gradually decreased. For example, the upper fluid channel 4120 may have a cylindrical shape, and the lower fluid channel 4140 may have an funnel shape. Specifically, the lower fluid channel 4140 may have an funnel shape, and the second fluid channel 4200 in a slit shape, which will be described below, may pass through the vertex of the funnel shape so that the lower fluid channel 4140 and the second fluid channel 4200 may be connected with each other. The lower fluid channel 4140 having the funnel shape may be divided into an upper end 4142 of the lower fluid channel and a lower end 4143 of the lower fluid channel depending on the shape of the lower fluid channel 4140. The lower end 4143 of the lower fluid channel may be located downstream of an upper end 4202 of the second fluid channel 4200 that will be described below. Furthermore, the angle θ1 formed by the lower end 4143 of the lower fluid channel may be a predetermined angle. For example, the angle θ1 formed by the lower end 4143 of the lower fluid channel may be an acute angle. In other words, when the vertical section of the lower fluid channel 4140 is viewed, the angle θ1 formed by the portion where the lower fluid channel 4140 and the second fluid channel 4200, which will be described below, adjoin each other may be an acute angle. The central axis of the upper fluid channel 4120 may be aligned with the central axis of the lower fluid channel 4140.

The section of the second fluid channel 4200 that is perpendicular to the flow direction of the processing liquid may have a slit shape. A distal end of the second fluid channel 4200 may be connected to the dispensing end 4300 of the first nozzle 4000, and therefore the second fluid channel 4200 may provide a passage through which the processing liquid is dispensed. Furthermore, the second fluid channel 4200 may connect with the first fluid channel 4100. For example, the second fluid channel 4200 may extend from the first fluid channel 4100. In addition, the upper end 4202 of the second fluid channel 4200, which is a straight line obtained by connecting points at which the second fluid channel 4200 starts, may be in agreement with the upper end 4142 of the lower fluid channel 4140.

The second fluid channel 4200 may be wider than the first fluid channel 4100. For example, the second fluid channel 4200 may have a gradually increasing width with respect to the width of the first fluid channel 4100. The second fluid channel 4200 may have a gradually increasing width toward the dispensing end 4300. The second fluid channel 4200 may have an arc shape when the front sectional view of the first nozzle 4000 is viewed from above. Furthermore, the central angle θ2 of the arc of the second fluid channel 4200 may be a predetermined angle. For example, the central angle θ2 of the arc of the second fluid channel 4200 may be an acute angle. Considering a circle drawn by extending the round portion of the arc, the center point C of the corresponding circle may be on the central axis of the first fluid channel 4100. Furthermore, the center point C may be located in the first fluid channel 4100. Moreover, the central axis of the first fluid channel 4100 along a direction in which the first processing liquid flows and the central axis of the second fluid channel 4200 along the direction in which the first processing liquid flows may be connected with each other in a straight line.

The dispensing end 4300 is a portion that connects with the second fluid channel 4200 and through which the processing liquid is dispensed from the first nozzle 4000. The dispensing end 4300 may have a rounded shape. For example, the dispensing end 4300 may have the same shape as the distal end of the second fluid channel 4200. For example, the dispensing end 4300 may have a rounded shape that is convex toward the dispensing direction of the processing liquid.

A method of machining the first nozzle 4000 described above will be described. The nozzle machining method may include a drilling step and a slit machining step.

The drilling step is a step of forming the first fluid channel 4100. In the drilling step, a drilling operation is performed at the upper end of the first nozzle 4000 in the direction in which the processing liquid flows. In the drilling step, the upper fluid channel 4120 and the lower fluid channel 4140 of the first fluid channel 4120 are formed together.

The slit machining step is a step of forming the second fluid channel 4200. The slit machining step is performed after the drilling step. In the slit machining step, a slit machining operation is performed at the dispensing end 4300 in the opposite direction to the direction in which the first fluid channel 4100 is formed. Furthermore, the slit machining operation is performed up to the upper end 4142 of the lower fluid channel 4140 from which the lower fluid channel 4140 starts.

Although it has been described that the slit machining step is performed after the drilling step, the nozzle machining method is not limited thereto. For example, in the reverse order to that described above, the drilling step may be performed after the slit machining step.

Figure 17:
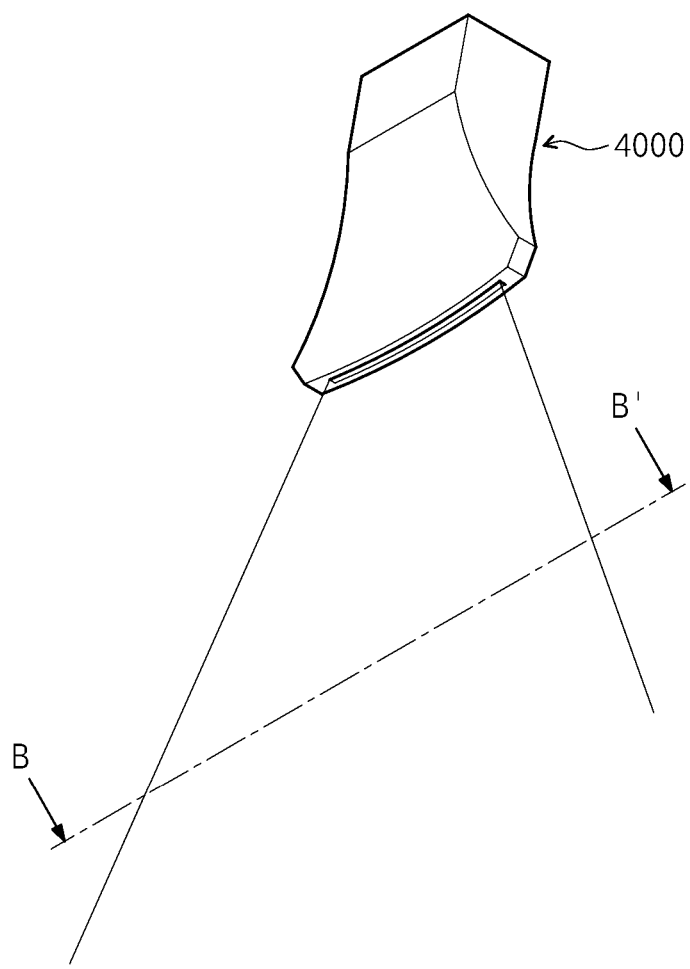
FIG. 17 is a view illustrating a state in which a liquid dispensing nozzle according to an embodiment of the inventive concept dispenses a processing liquid.
Figure 18:
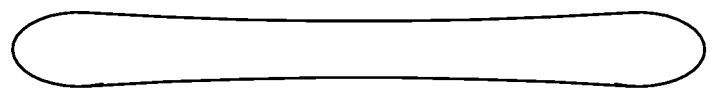
FIG. 18 is a sectional view taken along line B-B' of FIG. 17.

FIG. 17 is a view illustrating a state in which the liquid dispensing nozzle according to the embodiment of the inventive concept dispenses a processing liquid, and FIG. 18 is a sectional view taken along line B-B' of FIG. 17. Referring to FIGS. 17 and 18, the width of the liquid curtain of the processing liquid dispensed from the first nozzle 4000 becomes larger farther away from the dispensing end 4300. Referring to the cross-section of the liquid curtain of the processing liquid dispensed from the first nozzle 4000, the processing liquid is less concentrated on the opposite sides.

In the conventional liquid dispensing nozzle, the circular fluid channel and the slit fluid channel are obliquely connected together. Therefore, the processing liquid introduced into the circular fluid channel collides with the end of the circular fluid channel to generate the vortex. The vortex generates the bubbles in the processing liquid. The bubbles generated in the processing liquid cause the defect in the substrate treating process. However, according to an embodiment of the inventive concept, the central axis of the first fluid channel 4100 having a cylindrical shape and the central axis of the second fluid channel 4200 having a slit shape are connected with each other in a straight line. Accordingly, collision of a processing liquid in the fluid channels of the nozzle may be minimized. Furthermore, a vortex in the processing liquid flowing through the fluid channels may be minimized, and bubbles may be prevented from being generated in the processing liquid. As a result, a process of treating a substrate by dispensing the processing liquid may be effectively performed.

Because the central axis of the first fluid channel 4100 and the central axis of the second fluid channel 4200 are connected with each other in a straight line, collision of the processing liquid in the fluid channels may be minimized, and a flow of the processing liquid in the fluid channels may be stabilized. Accordingly, the width of the liquid curtain of the processing liquid dispensed from the dispensing end may be prevented from being decreased farther away from the dispensing end.

According to an embodiment of the inventive concept, with the stabilization of the processing liquid flow in the fluid channels, the angle θ1 formed by the lower end 4143 of the lower fluid channel 4120 of the first fluid channel 4100 is an acute angle. The flow speed of the processing liquid flowing through the second fluid channel 4200 may have a relatively constant magnitude. Specifically, the first fluid channel 4100 and the second fluid channel 4200 have different cross-sectional shapes. Accordingly, when the processing liquid flowing through the first fluid channel 4100 is introduced into the second fluid channel 4200, the flow speed of the processing liquid is varied. In the case where the angle θ1 formed by the lower end 4143 of the lower fluid channel 4120 is an acute angle as in the embodiment of the inventive concept, the path along which the processing liquid flows through the lower fluid channel 4140 in the process of being introduced into the second fluid channel 4200 from the first fluid channel 4100 is lengthened. The lower fluid channel 4140 has an funnel shape in which the width of the cross-section is gradually decreased. When the path of the processing liquid flowing through the lower fluid channel 4140 is lengthened, the variation in the width of the cross-section of the lower fluid channel 4140 per unit length is also decreased. Accordingly, the flow speed change per unit time of the processing liquid becomes smaller when the processing liquid flowing through the first fluid channel 4100 is introduced into the second fluid channel 4200. The processing liquid introduced into the second fluid channel 4200 experiences a small change in the flow speed. As a result, when the cross-section of the liquid curtain of the processing liquid dispensed from the dispensing end 4300 is viewed, the processing liquid is less concentrated on the opposite sides and is uniformly dispensed onto the substrate.

According to an embodiment, with the stabilization of the processing liquid flow in the fluid channels, the dispensing end 4300 has a rounded shape that is convex toward the dispensing direction of the processing liquid. That is, the processing liquid dispensed from the central region of the dispensing end 4300 flows along a longer path through the second fluid channel 4200 than the processing liquid dispensed from the edge regions of the dispensing end 4300. In this case, the processing liquid dispensed from the central region of the dispensing end 4300 contacts air with friction therebetween for a shorter period of time than the processing liquid dispensed from the edge regions of the dispensing end 4300. Accordingly, the processing liquid dispensed from the central region of the dispensing end 4300 more easily reaches the substrate W than the processing liquid dispensed from the edge regions of the dispensing end 4300. As a result, the processing-liquid concentration phenomenon may be further alleviated.

The above detailed description is based on the substrate treating apparatus according to the embodiment of the inventive concept. Without being limited thereto, however, the inventive concept is applicable to all apparatuses for treating a substrate.

According to the embodiments of the inventive concept, the liquid dispensing nozzle and the substrate treating apparatus including the same may improve efficiency in treating a substrate.

Furthermore, according to the embodiments of the inventive concept, the liquid dispensing nozzle may minimize a vortex caused by a processing liquid flowing through a fluid channel in the liquid dispensing nozzle.

Moreover, according to the embodiments of the inventive concept, the liquid dispensing nozzle may uniformly dispense a processing liquid onto a substrate.

In addition, according to the embodiments of the inventive concept, the liquid dispensing nozzle may be easily machined.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a support unit including a support plate having a seating surface on which the substrate is supported; and
   a liquid dispensing unit configured to dispense a first processing liquid onto the substrate,
   wherein the liquid dispensing unit includes:
   a first nozzle configured to dispense the first processing liquid,
   wherein the first nozzle includes:
      a first fluid channel that is formed in the first nozzle and through which the first processing liquid flows; and
      a second fluid channel that is formed in the first nozzle and is in communication with the first fluid channel, the second fluid channel being connected to a dispensing end of the first nozzle,
   wherein the second fluid channel has a larger width than the first fluid channel, and
   wherein a central axis of the first fluid channel along a direction in which the first processing liquid flows and a central axis of the second fluid channel along the direction in which the first processing liquid flows are connected with each other in a straight line.

2. The apparatus of claim 1, wherein the first fluid channel has a circular cross-section that is perpendicular to a lengthwise direction of the first fluid channel, and
   wherein the second fluid channel has a slit-shaped cross-section that is perpendicular to a direction in which the first processing liquid flows.

3. The apparatus of claim 2, wherein the width of the second fluid channel is gradually increased in a direction from the first fluid channel to the dispensing end.

4. The apparatus of claim 3, wherein the first fluid channel includes:
   an upper fluid channel, wherein an area of a cross-section perpendicular to a lengthwise direction of the upper fluid channel is constant; and
   a lower fluid channel extending from the upper fluid channel, wherein an area of a cross-section perpendicular to a lengthwise direction of the lower fluid channel is gradually decreased, and
   wherein a lower end of the lower fluid channel is disposed downstream of an upper end of the second fluid channel.

5. The apparatus of claim 4, wherein the upper end of the second fluid channel is in agreement with an upper end of the lower fluid channel.

6. The apparatus of claim 5, wherein the lower fluid channel has an funnel shape, and
   wherein a central axis of the lower fluid channel is in agreement with the central axis of the first fluid channel and the central axis of the second fluid channel.

7. The apparatus of claim 6, wherein an angle formed by a portion where the lower fluid channel and the second fluid channel adjoin each other is an acute angle, when a vertical section of the lower fluid channel is viewed.

8. The apparatus of claim 6, wherein the second fluid channel has an arc shape, and
wherein the center of the arc is on the central axis of the first fluid channel.

9. The apparatus of claim 8, wherein a central angle of the arc is an acute angle.

10. The apparatus of claim 1, wherein the dispensing end has a rounded shape that is convex toward a direction in which the first processing liquid is dispensed.

11. The apparatus of claim 10, wherein the liquid dispensing unit further includes:
a second nozzle configured to dispense a second processing liquid different from the first processing liquid; and
a third nozzle configured to dispense the first processing liquid that is the same as the first processing liquid dispensed by the first nozzle,
wherein the second nozzle and the third nozzle dispense the second processing liquid and the first processing liquid in a manner of a stream, respectively,
wherein the first processing liquid is a chemical, and
wherein the second processing liquid is deionized water.

12. The apparatus of claim 11, wherein the first nozzle dispenses the first processing liquid onto a top side of the substrate, which is supported on the support unit, in an oblique direction.

* * * * *